United States Patent [19]
Mitsutsuka

[11] Patent Number: 4,798,988
[45] Date of Patent: Jan. 17, 1989

[54] OPTIMUM BIAS CIRCUIT FOR A CONVOLVER

[75] Inventor: Syuichi Mitsutsuka, Tokyo, Japan

[73] Assignee: Clarion Co., Ltd., Tokyo, Japan

[21] Appl. No.: 87,694

[22] Filed: Aug. 20, 1987

[30] Foreign Application Priority Data

Aug. 22, 1986 [JP] Japan ................................ 61-196594
Sep. 2, 1986 [JP] Japan ................................ 61-207458
Sep. 19, 1986 [JP] Japan ................................ 61-221576

[51] Int. Cl.$^4$ ..................... H01L 41/08; H03H 9/30
[52] U.S. Cl. ........................ 310/313 R; 310/313 D; 333/150; 364/821
[58] Field of Search ................ 310/313; 333/150–155, 333/193–196; 357/10, 26, 71; 364/821

[56] References Cited

U.S. PATENT DOCUMENTS

| | | | |
|---|---|---|---|
| 3,975,696 | 8/1976 | Kantorowicz | 310/313 B X |
| 4,037,174 | 7/1977 | Moore | 310/313 B |
| 4,194,171 | 3/1980 | Jelks | 310/313 A X |
| 4,388,599 | 6/1983 | Gautier et al. | 333/150 |
| 4,448,805 | 5/1984 | Lewis | 364/821 X |
| 4,473,767 | 9/1984 | Minagawa et al. | 310/313 D |
| 4,600,853 | 7/1986 | Whitlock et al. | 310/313 B |

OTHER PUBLICATIONS

MZOS-FET-TYPE Convolver, by K. Matsumots et al, 1980 Ultrasonics Symposium (IEEE), pp. 129–132.

*Primary Examiner*—Mark O. Budd
*Attorney, Agent, or Firm*—Flynn, Thiel, Boutell & Tanis

[57] ABSTRACT

An optimum bias circuit for a convolver according to this invention searches automatically a bias voltage, which makes the convolution efficiency of a surface acoustic wave convolver highest and applies it to the gate electrode of the convolver. It consists of an impedance bridge consisting of a plurality of fixed impedances, a reference impedance, and an impedance constituted by the gate electrode of the convolver, a signal source for the impedance bridge, an amplifier amplifying the output of the bridge, a differential amplifier amplifying the signal for the bridge, a phase detector, a DC amplifier and an integrating circuit, and is so constructed that the phase detector detects the phase of the output of the bridge (amplified signal) by using the output of the differential amplifier as a reference signal; the DC amplifier amplifies the output after the phase detection; the integrator integrates the output of the DC amplifier; and the output of the integrator is applied to the gate electrode of the convolver.

25 Claims, 12 Drawing Sheets

OPTIMUM BIAS CIRCUIT FOR A CONVOLVER

FIELD OF THE INVENTION

This invention relates to a circuit for applying an optimum bias voltage to a surface accoustic wave (hereinbelow abbreviated to SAW) convolver constituted by a piezo-electric film and a semiconductor substrate.

BACKGROUND OF THE INVENTION

In a monolithic SAW convolver having a structure (piezo-electric film/semiconductor) or a structure (piezo-electric film/insulator/semiconductor) or an air gap type SAW convolver having a structure (piezo-electric film/air/insulator/semiconductor) the concolution efficiency (hereinbelow abbreviated to $F_r$) depends, in general, on the bias voltage applied to the gate electrode. FIG. 2 shows an example of the relation between the bias voltage and $F_r$ for an SAW convolver having a structure ($ZnO/SiO_2/Si$). FIG. 2 shows also the relation between the bias voltage and the capacitance between the gate electrode and the ground (hereinbelow called simply C-V characteristics). These C-V characteristics play an important role in the operational principle of this invention and will be explained later.

FIG. 2 indicates that $F_r$ has a maximum value at a certain bias voltage $V_{op}$. $V_{op}$ is the optimum biasas voltage for the convolver and it is desirable to operate the convolver always at this bias voltage.

However, when a bias voltage is applied to a convolver, in many cases interfacial energy levels at the interface of semiconductor/insulator, traps at the interface of insulator/piezo-electric film, traps in the piezo-electric film, etc. can capture electrons and holes and it can take a fairly long time to stabilize the operation of the convolver because of the time necessary for the capture or generation. Further, because of these traps or interfacial energy levels described above the relation between $F_r$ and the bias voltage can depend on the history of the bias voltage applied heretofore and thus, if a bias voltage different from $V_{op}$ has been applied thereto, the optimum bias voltage thereafter can shift with respect to $V_{op}$. These phenomena are reported in an article entitled "A Detailed Theory of the Monolithic Zinc Oxide on Silicon Convolver" by B. T. Khuri-Yakub and G. S. Kino (IEEE Transaction on Sonics and Ultrasonics, Vol. SU-24, No. 1, January 1977 (USA), p. 34).

Because of these characteristics, when a convolver is started, actually a fairly long warming up time is necessary for $F_r$ to become sufficiently great, measured from the point of time where the bias voltage $V_{op}$ begins to be applied to the convolver.

Further, since $V_{op}$ varies generally depending on the temperature, it is difficult to operate the convolver always with the highest $F_r$ by the method, by which a constant bias is applied thereto.

OBJECT OF THE INVENTION

The object of this invention is to provide a circuit for controlling the bias voltage applied to the SAW convolver so that the convolver can be operated always with the highest $F_r$, in order to surmount these difficulties described above.

SUMMARY OF THE INVENTION

In order to achieve this object an optimum bias circuit for a convolver according to this invention is characterized in that it comprises an impedance bridge constructed by a plurality of fixed impedances, a reference impedance and a convolver; a first amplifier amplifying the output of the bridge; a signal source for the bridge; a second amplifier amplifying the signal for the bridge; phase detector means, which detects the phase of the output of the first amplifier by using the output of the second amplifier as a reference signal; a DC amplifier amplifying the output of the phase detector means; and integrating means integrating the output of the DC amplifier and applying a signal thus obtained to the gate of the convolver.

In the circuit described above, the output of the phase detector means may be inputted in the integrator after having been amplified by the DC amplifier, the output of which integrator is applied directly to the gate of said convolver.

The integrator may be replaced by a low pass filter, whose cut-off frequency is sufficiently low with respect to the frequency of the signal for the bridge and which makes only low frequency components pass through.

Further it is also possible to construct the circuit so as to amplify the signal for the bridge by means of a normal amplifier, to use a signal thus obtained as a reference signal for the phase detector, to amplify the output of the bridge by means of a differential amplifier and to detect the phase of the output of the differential amplifier.

The first amplifier stated above is a normal amplifier; the second amplifier is a differential amplifier; one end of the impedance bridge is grounded; the output of the bridge is taken out from the other end of the diagonal passing through the one end; and the output of the signal source for the bridge is applied to the other two ends of the impedance bridge and at the same time inputted in the two inputs of the second amplifier. Or the first amplifier is a differential amplifier; the second amplifier is a normal amplifier; one end of the impedance bridge and one end of the signal source for the bridge are grounded; the signal for the bridge is inputted in the other end of the diagonal passing through the grounded end of the impedance bridge and in the second amplifier, and the output of the bridge is taken out from the other two ends of the impedance bridge and at the same time inputted in the two inputs of the first amplifier.

This circuit has been designed by paying attention to the fact that the convolution output of the convolver and the impedance (admittance) of the gate electrode of the convolver are very closely correlated to each other. In FIG. 2, comparing $F_r$ with the C-V characteristics, it can be noticed that $F_r$ has a peak at a certain bias voltage (optimum bias voltage), while the C-V characteristics varies monotonically with respect to the bias voltage. Since both the value of $F_r$ and that of C vary depending on the state of the surface of the semiconductor, the bias characteristics and the C-V characteristics are closely correlated, and the relation between $F_r$ and C doesn't change, even if the characteristics of $F_r$ have a history that a bias voltage has been applied to the convolver. That is, even if the characteristics of $F_r$ are shifted along the bias axis, the C-V characteristics shift also in a similar manner, and the converse is also true. Consequently the capacity $C_{op}$ at the optimum bias voltage $V_{op}$ has a same value, even if the characteristics of $F_r$ have a history that a bias voltage has been applied to the convolver. Therefore, when the capacity C of the gate electrode is always monitored and the bias voltage is so controlled that it is equal to $C_{op}$, the convolver can be operated always at its optimum bias voltage. According to this invention, the capacity C is monitored by means of an impedance bridge and the bias voltage is controlled by means of a phase detector and an integrator.

These and other objects and advantages of the present invention will become apparent by reference to the following description and drawings.

DETAILED DESCRIPTION

Figure 1:
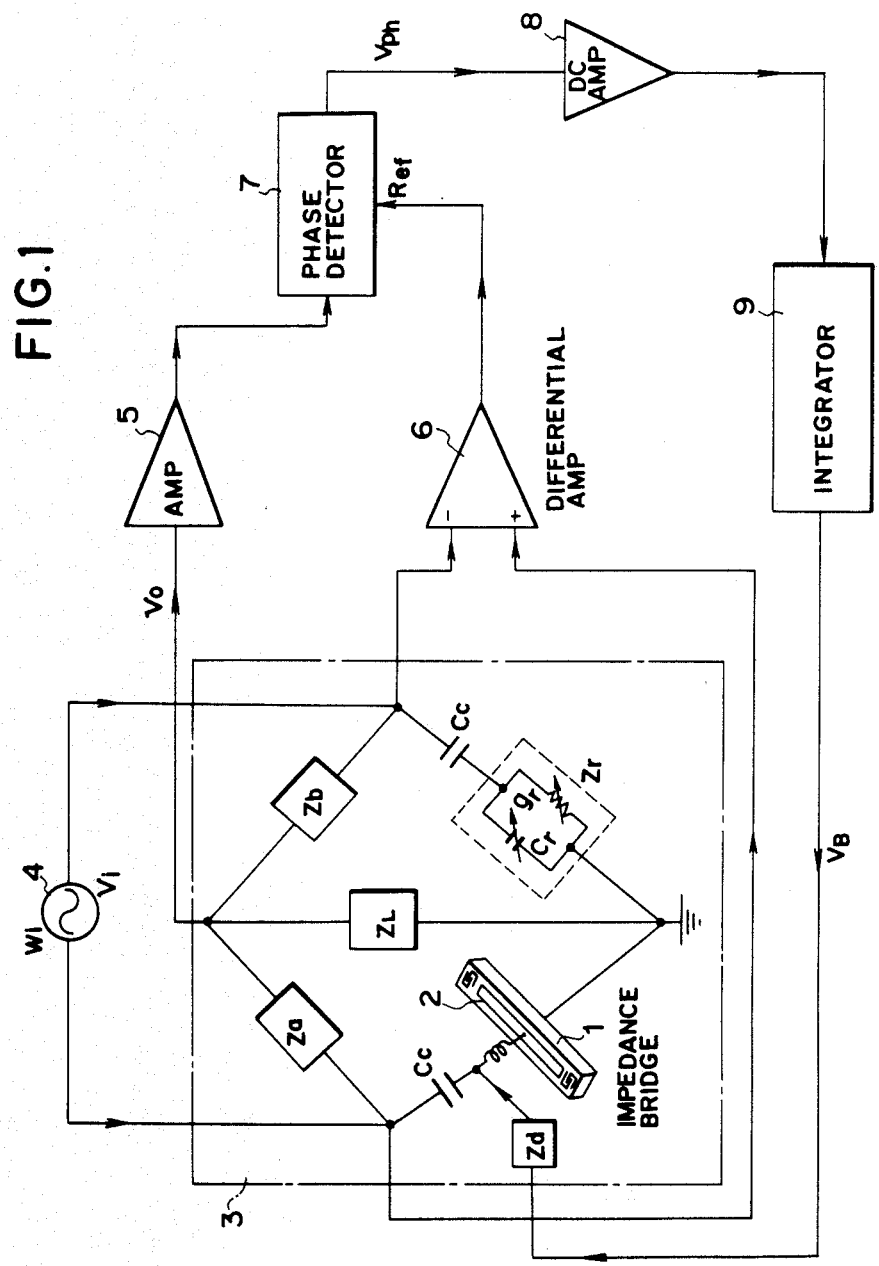
FIG. 1 is a block diagram illustrating the construction of an optimum bias circuit for a convolver according to a first embodiment of this invention.

FIG. 1 is a block diagram illustrating the construction of an optimum bias circuit for a convolver according to a first embodiment of this invention, in which reference numeral 1 is an SAW convolver; 2 is the gate electrode of the convolver; 3 is an impedance bridge; 4 is a signal souce for the bridge; 5 is an amplifier; 6 is a differential amplifier; 7 is a phase detector; 8 is a DC amplifier; 9 is an integrator; $Z_a Z_b$, $Z_d$, and $Z_L$ are fixed impedances; $Z_r$ is a reference impedance; and $C_c$ is a DC cut capacitor.

The impedance bridge 3 is constructed by the fixed impedances $Z_a$, $Z_b$ and $Z_L$, the reference impedance $Z_r$ and the convolver 1. Concerning the connection of the convolver, the gate electrode of the convolver is connected with the grounded electrode of the substrate. The capacitor $C_c$ in FIG. 1 is inserted for the sake of cutting off the DC component in order that the bias voltage applied to the gate electrode 2 of the convolver is not applied to the impedances $Z_a$, $Z_b$, $Z_L$ and $Z_r$. $C_c$ is set to a sufficiently large value so that it has a sufficiently small impedance at the frequency $\omega_i$ of the signal for the bridge and doesn't influence the balance of the bridge.

The frequency $\omega_i$ of the signal source 4 for the bridge is set to a value, which is different from the working frequency of the convolver 1 so that it doesn't influence the output of the convolver.

The signal for the bridge is amplified by the differential amplifier 6 and used as the reference signal for the phase detector 7. The phase of the output of the bridge is detected by using the signal stated above, after it has been amplified by the amplifier 5. The signal after the phase detection is amplified by the DC amplifier 8 and integrated by the integrator 9. The output after the integration is applied to the gate electrode 2 of the convolver 1 through the impedance $Z_d$ and gives the convolver the bias voltage. $Z_d$ is so set that the DC component can pass therethrough, but it has a sufficiently great impedance for the frequency $\omega_i$ of the signal for the bridge or for the working frequency of the convolver in order that the output impedance of the integrator 9 doesn't influence the balance of the bridge and the convolution output. $Z_d$ may be usually satisfactorily a high resistance.

Further, when the gain of the DC amplifier in FIG. 1 is sufficiently large, a low pass filter may be used instead of the integrator 9.

In this case the cut off frequency of the low pass filter is so set that it is sufficiently low with respect to the frequency $\omega_i$ of the signal for the bridge.

The setting of the impedances $Z_a$, $Z_b$, $Z_L$ and $Z_r$ of the bridge will be explained later.

Hereinbelow the working principle of this circuit will be explained.

Figure 3:
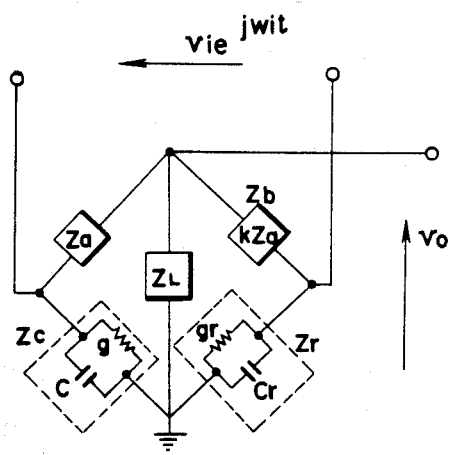
FIG. 3 is an equivalent circuit diagram of an impedance bridge.

Now it is supposed that the fixed impedances $Z_a$, $Z_b$ and $Z_L$ of the impedance bridge indicated in FIG. 3 satisfy the following condition;

$$Z_b = kZ_a \text{ (k:real number)} \tag{1}$$

$$|Z_L| >> |Z_a|, \ |Z_L| >> |Z_b| \tag{2}$$

At this time the signal $v_i$ applied to the bridge and the output $v_o$ of the bridge can be expressed approximately by the following relation;

$$v_0 \approx \frac{kZ_s - Z_r}{(Z_s + Z_r) \cdot (1 + k)} \cdot v_i e^{j\omega it} \tag{3}$$

where $Z_s$ is the impedance of the convolver and $Z_r$ is the reference impedance. The impedance of the convolver includes, apart from the capacitance C indicated in FIG. 2, a conductance component g in parallel due to the influences of the resistance of the semiconductor substrate and interfacial energy levels at the interface semiconductor/insulator. For this reason, in order to obtain the balance of the bridge, a parallel conductance $g_r$ is usually necessary also for the reference impedance. However, in the case where the frequency $\omega_i$ is sufficiently high, the conductances g and $g_r$ are sufficiently small with respect to the admittances $\omega_i C$ and $\omega_i C_r$. In such a case, Eq. (3) can be transformed approximately as follows;

$$v_0 \approx -\frac{C - kC_r}{(C + C_r) \cdot (1 + k)} \cdot v_i e^{j\omega it} \quad (4)$$

Therefore the capacitance of the reference impedance is set to a value as indicated below with respect to the optimum capacitance $C_{op}$ of the convolver;

$$C_r = 1/k \; C_{op} \quad (5)$$

In this case the output of the bridge is expressed as follows;

$$v_0 \approx -\frac{k}{(1 + k)} \cdot \frac{(C - C_{op})}{(C + C_r)} \cdot v_i e^{j\omega it} \quad (6)$$

That is, when the fixed impedances are so set that they satisfy Eqs. (1) and (2) and the capacitance of the reference impedance is set so as to satisfy Eq. (5), the output of the bridge has a value, which is proportional to the difference between the capacitance C of the convolver and the optimum capacitance $C_{op}$.

In such a case the following relation is valid between the signal applied to the bridge and the output of the bridge;

if $C > C_{op}$, $V_O$ and $V_i e^{j\omega it}$ are in anti-phase if $C < C_{op}$, $v_O$ and $v_i e^{j\omega it}$ are in phase  (7)

if $C = C_{op}$, $v_O = 0$

Figure 4:
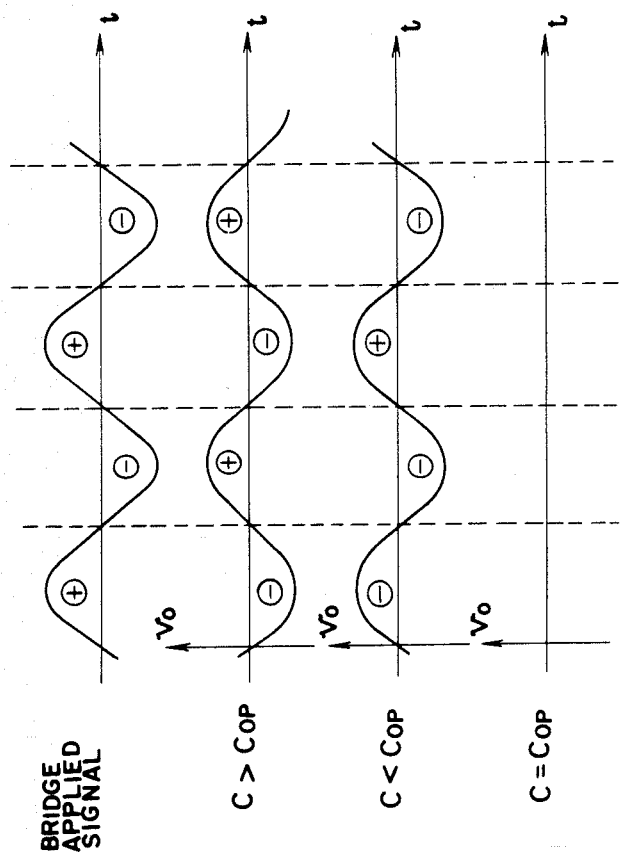
FIG. 4 is a scheme showing the waveform of an output signal of the bridge.
Figure 5:
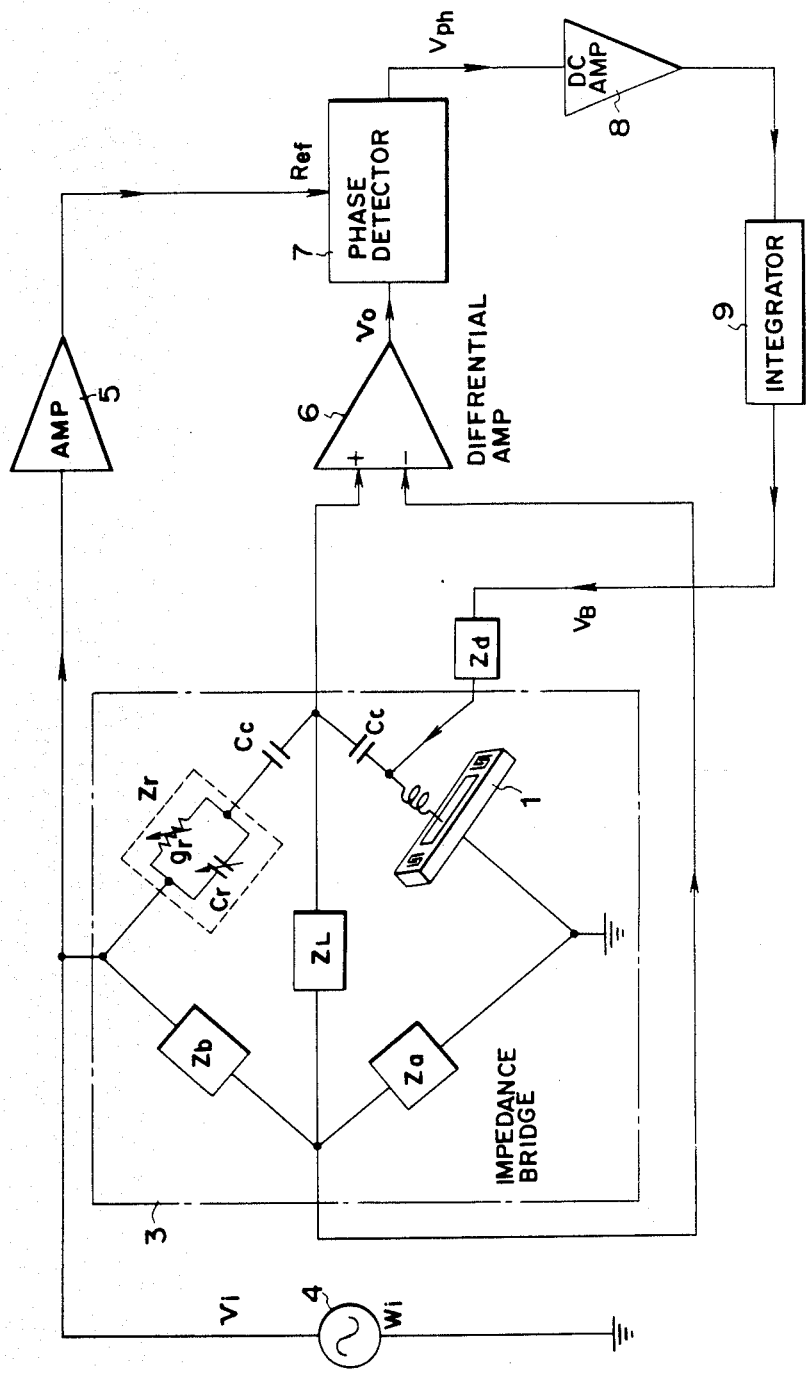
FIG. 5 is a block diagram illustrating the construction of an optimum bias circuit for a convolver according to a second embodiment of this invention.

FIG. 4 shows this relation in a graph.

Consequently, when the phase of the output signal of the bridge is detected by using the signal applied to the bridge as the reference signal, as indicated by the block diagram in FIG. 1, its output $V_{ph}$ can be expressed as follows;

if $C > C_{op}$, $V_{ph} < 0$ if $C < C_{op}$, $V_{ph} > 0$ if $C = C_{op}$, $V_{ph} = 0$  (8)

Figure 2:
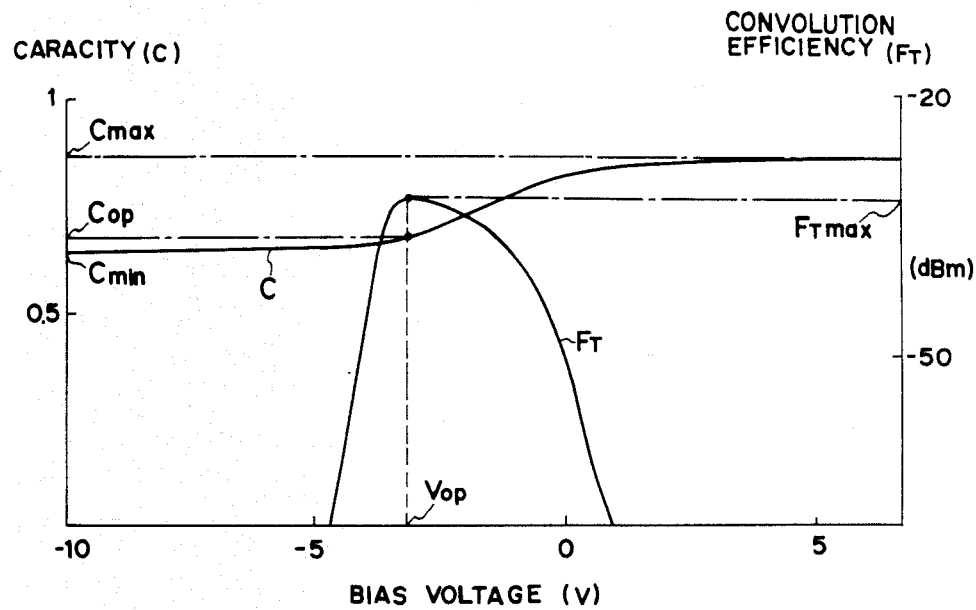
FIG. 2 is a graph indicating the relation among the bias voltage (V), the convolution efficiency ($F_\tau$) and the capacity between the gate electrode and the ground (C)

Then, since the capacity C of the convolver varies monotonically with respect to the bias voltage $V_B$, as indicated in FIG. 2, the bias voltage $V_B$ has the following relations with respect to the optimum bias voltage $V_{op}$;

if $C > C_{op}$, $V_B > V_{op}$ if $C < C_{op}$, $V_B < V_{op}$ if $C = C_{op}$, $V_B = V_{op}$  (9)

Therefore the relations indicated by Eq. (8) are equivalent to the followings;

if $V_B > V_{op}$, $V_{ph} < 0$ if $V_B < V_{op}$, $V_{ph} > 0$ if $V_B = V_{op}$, $V_{ph} = 0$  (10)

Consequently, when the output $V_{ph}$ after the phase detection is amplified by the DC amplifier 9 and the signal obtained by integrating it by means of the integrator 9 is fedback as the bias voltage $V_B$ to the convolver 1, as indicated in FIG. 1, the following relations can be obtained;

if $V_B > V_{op}$, $V_B$ decreases, if $V_B < V_{op}$, $V_B$ increases, and if $V_B = V_{op}$, $V_B$ doesn't change.  (11)

Therefore, even if the applied voltage $V_B$ is not equal to the optimum bias voltage $V_{op}$ at a certain point of time, $V_B$ is converged on $V_{op}$ and stabilized with the lapse of time.

Furthermore, although the integrator 9 is disposed after the DC amplifier 8 in FIG. 1, even if, to the contrary, the DC amplifier 8 is disposed after the integrator 9, the whole circuit works completely similarly and thus it may be constructed in such a manner.

In addition, although the signal for the bridge is amplified by the differential amplifier 6 and the output of the bridge is amplified by the normal amplifier 5 in FIG. 1, it is also possible to reverse this order, i.e. to amplify the signal for the bridge by means of the normal amplifier 5 and the output of the bridge by means of the differential amplifier 6.

Figure 6:
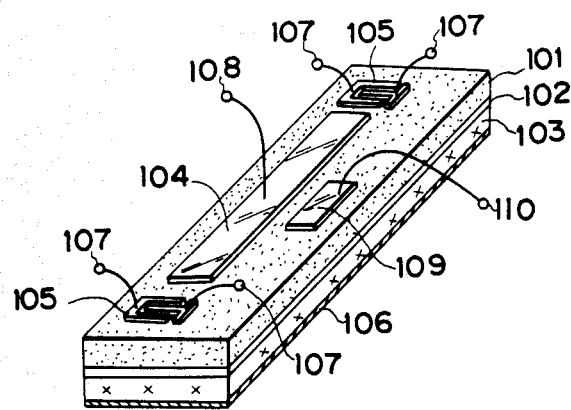
FIGS. 6 and 7 are perspective views illustrating multi-layer type SAW convolvers for realizing this invention.
Figure 7:
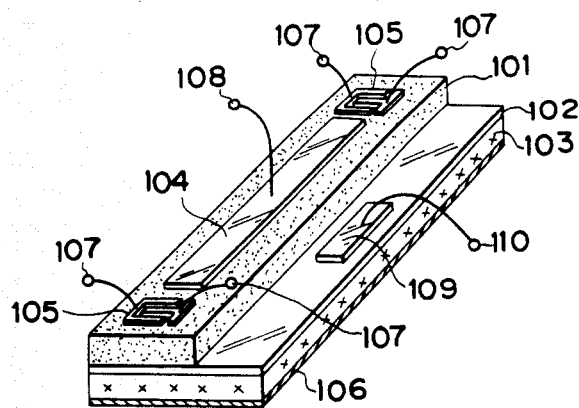

FIGS. 6 and 7 are perspective views illustrating multi-layer type SAW convolvers used for realizing this invention, in which reference numeral 101 is a piezoelectric film; 102 is an insulating layer; 103 is a semiconductor substrate; 104 is a gate electrode; 105 is comb-shaped electrodes; 106 is a rear surface electrode; 107 is an input terminal; 108 is an output terminal; 109 is a monitor electrode; and 110 is a monitor terminal. The monitor electrode 109 can be used for the detection of the C-V characteristics of the structure (metal/piezoelectric film/insulator/semiconductor structure) of the gate portion of the convolver. Although FIG. 6 shows a convolver having a (piezo-electric film/insulator/semiconductor) structure, the monitor electrode may be disposed on a convolver having a (piezo-electric film/semiconductor) structure. Further, although only one monitor electrode is indicated in FIG. 6, a plurality of monitor electrodes may be disposed in the proximity of the gate electrode 104.

In the convolver indicated in FIG. 7 a part of the piezo-electric film 101 is removed in the proximity of the gate electrode 104 and the monitor electrode 109 is formed there. In this case, the monitor electrode 109 can be used for the detection of the C-V characteristics of the MOS structure (metal/insulator/semiconductor structure) of the convolver. Although only one monitor electrode 109 is indicated also in FIG. 7, a plurality of monitor electrodes may be disposed.

Figure 8:
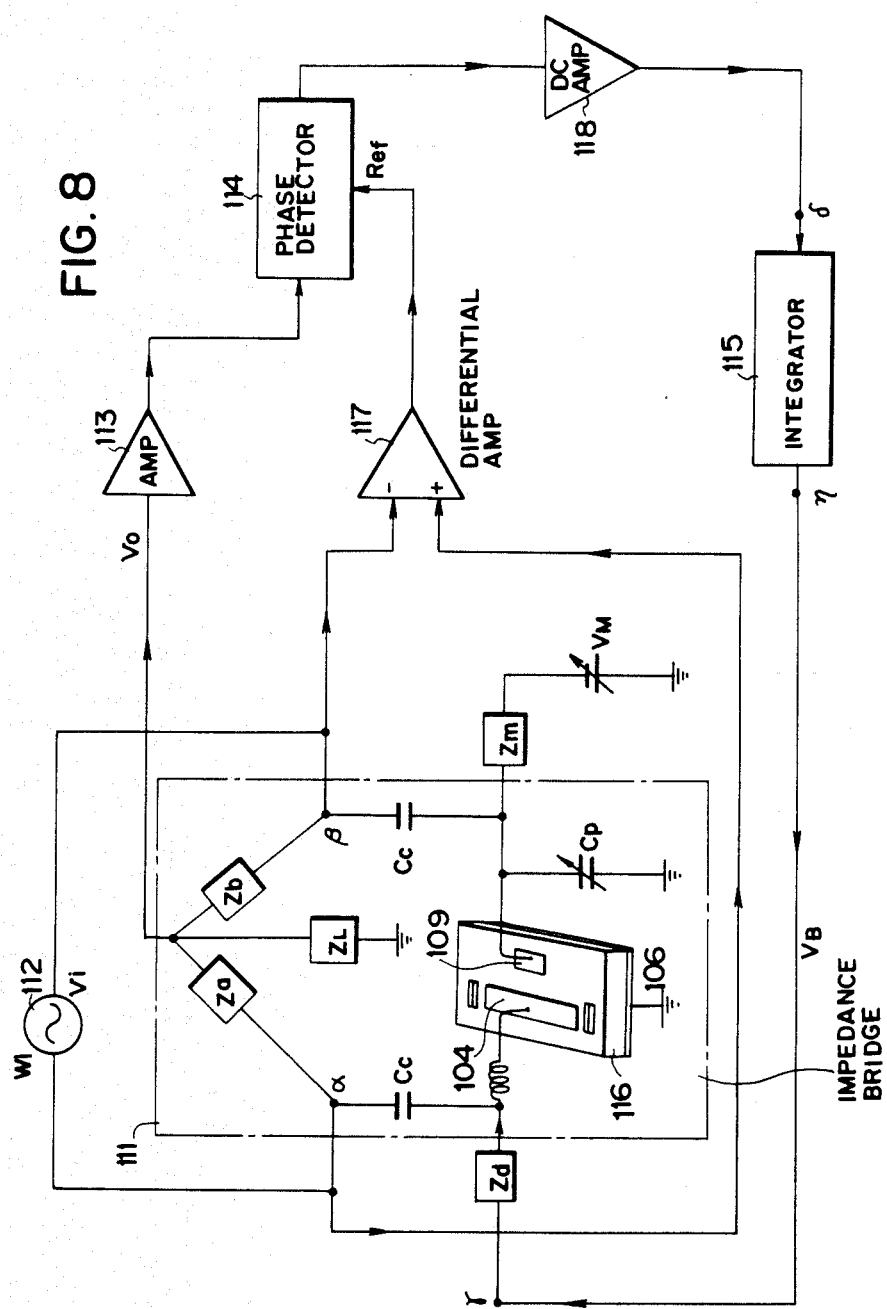
FIGS. 8 and 9 are block diagrams indicating the construction of optimum bias circuits for the device using the multi-layer type SAW convolver indicated in FIG. 6.
Figure 9:
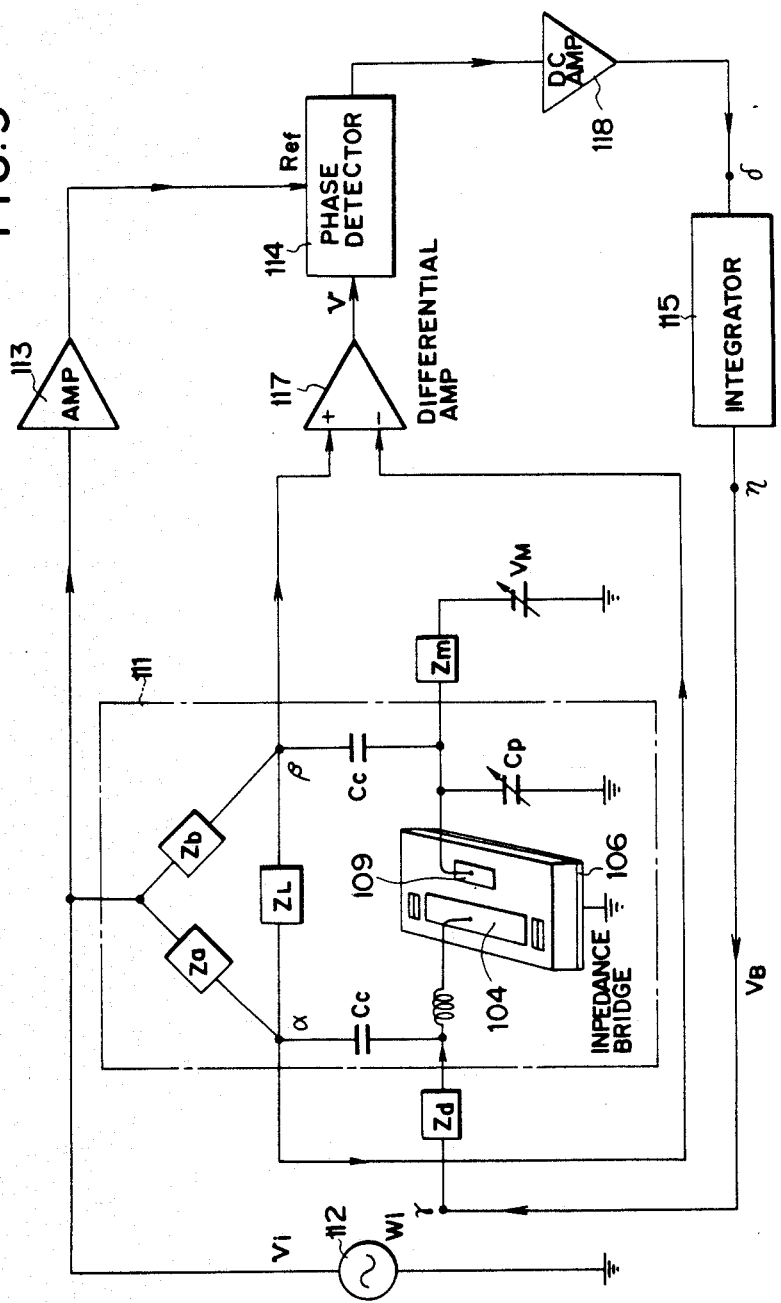
Figure 12A:
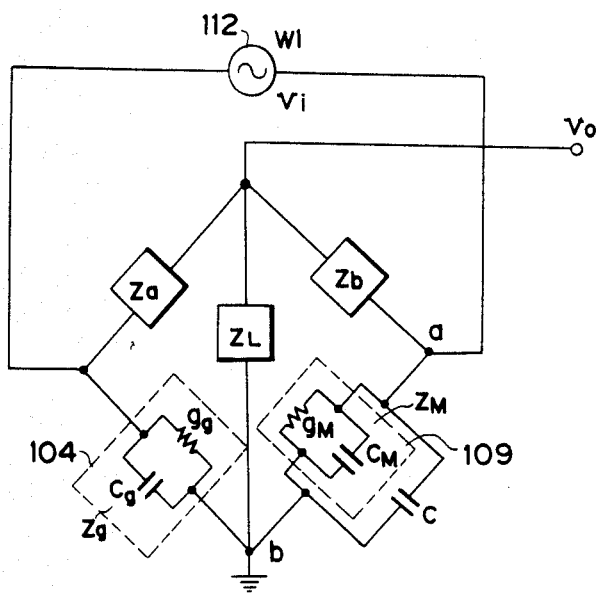
FIG. 12 is an equivalent circuit diagram of the impedance bridge.
Figure 12B:
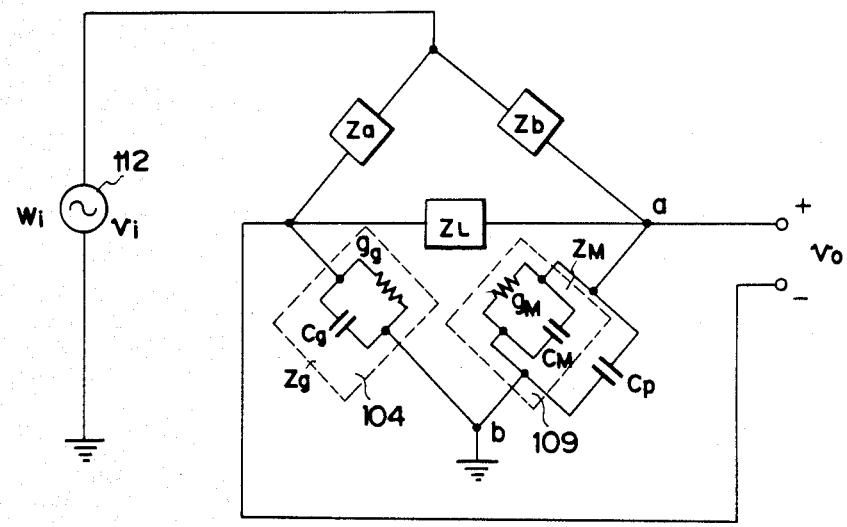

FIGS. 8 and 9 are block diagrams illustrating optimum bias circuits constructed by using the convolver, whose structure is indicated in FIG. 6. Each of the circuits indicated in FIGS. 8 and 9 is constructed principally by an impedance bridge 111, a signal source 112 for the bridge, an amplifier 113, a phase detector 114, and an integrator 115. The impedance bridge 111 consists of fixed impedances $Z_a$, $Z_b$ and $Z_L$, an impedance $Z_g$ inserted between the gate electrode 104 of the convolver 116 and the rear surface electrode 106, an impedance $Z_M$ inserted between the monitor electrode 109 and the rear surface electrode 106, and a capacitor $C_P$ connected in parallel to the monitor electrode 109. Its equivalent circuits are indicated in FIGS. 12(a) and 12(b). FIG. 12 (a) shows the portion of the impedance bridge indicated in FIG. 8. The capacitor $C_c$ indicated in FIGS. 8 and 9 cuts the DC component so that the bias voltage $V_B$ applied to the gate electrode 104 of the convolver 116 and the bias voltage $V_M$ applied to the monitor electrode 109 are not applied to the impedances $Z_a$, $Z_b$ and $Z_L$. $C_c$ is set to a sufficiently great value so that it has a sufficiently small impedance for a frequency $\omega_i$ of the signal source for the bridge and no influences on the balance of the bridge.

The frequency $\omega_i$ of the signal source for the bridge is set to a value, which is different from the working frequency of the convolver so that it doesn't influence the output of the convolver.

In FIGS. 8 and 9 impedances $Z_d$ and $Z_m$ are so set that they make the DC component pass through but have sufficiently great impedances for the frequency $\omega_1$ of the signal for the bridge and the working frequency of the convolver so that the output impedance of the integrator 115 and the output impedance of the DC power source $V_M$ for the monitor electrode 109 don't influence the balance and the convolution output of the bridge.

The circuits indicated in FIGS. 8 and 9 are so constructed that the phase of the output of the impedance bridge is detected by using the signal for the bridge as the reference signal and the signal thus obtained is applied to the gate electrode 104 through the integrator 115 after having been DC-amplified. The difference between the circuit indicated in FIG. 8 and that indicated in FIG. 9 consists in the difference in the manner of the construction of the bridge. In figures reference numeral 117 is a differential amplifier and 118 is a DC amplifier.

Figure 10:
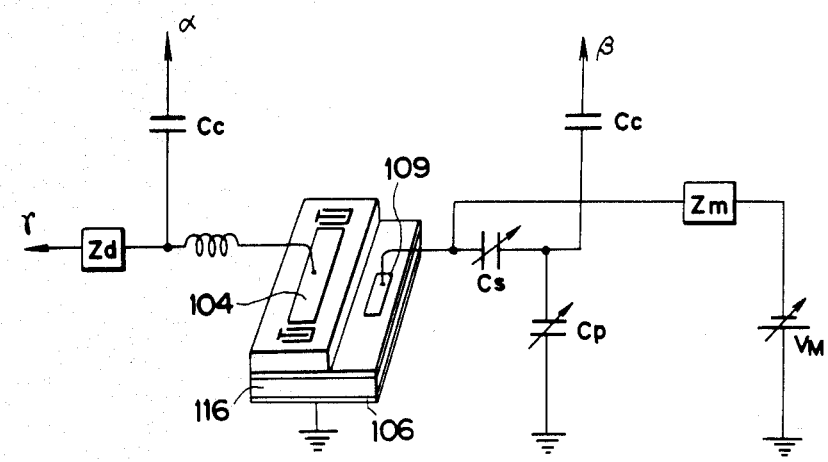
FIG. 10 is a scheme illustrating the peripheral circuit for the convolver in the case where the SAW convolver indicated in FIG. 7 is used.
Figure 13:
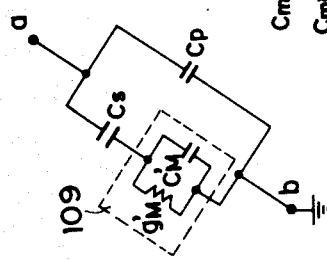
FIG. 13 is an equivalent circuit diagram of the monitor electrode portion.

FIG. 10 shows a peripheral circuit of the convolver, in the case where the optimum bias circuit is constructed by using a convolver having the construction indicated in FIG. 7. When the terminals $\alpha$, $\beta$ and $\gamma$ in FIG. 10 are connected with the terminals $\alpha$, $\beta$ and $\gamma$ in FIGS. 8 and 9, an optimum bias circuit using a convolver having the construction indicated in FIG. 7 is construction. The difference of this circuit from the case of a convolver having the construction indicated in FIG. 6 consists in that a capacity $C_s$ connected in series to the monitor electrode is added. In this case the construction of the bridge corresponds to the construction where the monitor electrode portion of the convolver indicated in FIGS. 12(a) and 12(b) and the parallel impedance $C_P$ are changed as indicated in FIG. 13.

The value of the series capacitance $C_s$ is set desirably to that obtained when the piezo-electric film is put between two metallic electrodes having an area equal to that of the monitor electrode 109. In this way the series capacitance of $C_s$ and the monitor electrode portion can be equal to the capacitance of the monitor electrode portion in the case of the structure indicated in FIG. 6. In the case of the structure indicated in FIG. 6 the ratio of the capacitance of the gate electrode portion to that of the monitor electrode portion is equal to ratio of the areas of these electrodes, if the state of the surface of the semi-conductor remains to be equal. In the case of the structure indicated in FIG. 6 also, if the value of $C_s$ is set as stated previously, what is stated for the case of the structure indicated in FIG. 6 remains valid. This is important for the operation of the optimum bias circuit, as stated later.

Figure 11:
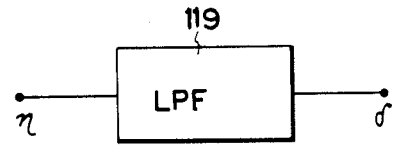
FIG. 11 is a scheme for explaining a modification, in the case where the DC amplifier has a sufficiently great gain.

In FIGS. 8 and 9, when the gain of the DC amplifiers 118 is sufficiently great, a low pass filter 119 can be used instead of the integrator 115, as indicated in FIG. 11. When the terminals $\eta$ and $\delta$ are connected with the terminals $\eta$ and $\delta$ instead of the integrator 115 in FIGS. 8 and 9, the circuits indicated in FIGS. 8 and 9 can work as they are. In this case the cut off frequency of the signal for the bridge is supposed to be sufficiently low with respect to the frequency $\omega_i$ of the signal for the bridge.

Now the operation of the optimum bias circuit using a convolver having the construction indicated in FIGS. 6 and 7 will be explained briefly, referring to FIGS. 8 to 11.

Figure 15:
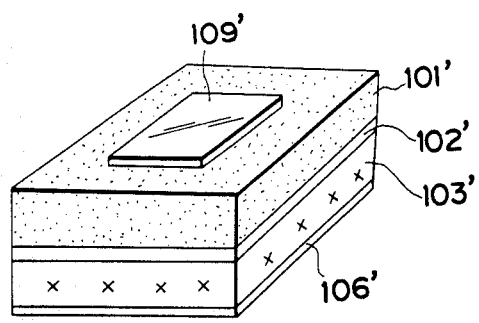
FIGS. 15 and 16 are perspective views of reference elements used for realizing this invention.

Comparing the bias characteristics of $F_T$ with the C-V characteristics of the gate electrode 4 in FIG. 15, it can be known that the capacitance of the gate electrode 104 has a certain value $C_{OP}$ at the optimum bias voltage $V_{OP}$. Then, when the capacity of the gate electrode 104 is monitored and the bias voltage ($V_B$) is controlled automatically so that capacity of the gate electrode 104 is $C_{OP}$, the bias voltage should be held at the optimum bias voltage $V_{OP}$. According to this invention this reference capacitance $C_{OP}$ is set by using the capacitance of the monitor electrode portion and the capacitances $C_P$ and $C_S$ connected in parallel or in series therewith. The impedance bridge 111 compares the capacitance of the gate electrode 104 with the set reference capacitance and detects the difference therebetween. The phase detector 114 and the integrator 115 are used for controlling the bias voltage so that the difference between the capacitance of the gate electrode 104 and the reference capacitance is made smaller.

Now the advantage of the use of the monitor electrode 109 indicated in FIGS. 6 and 7 will be explained.

Figure 14:
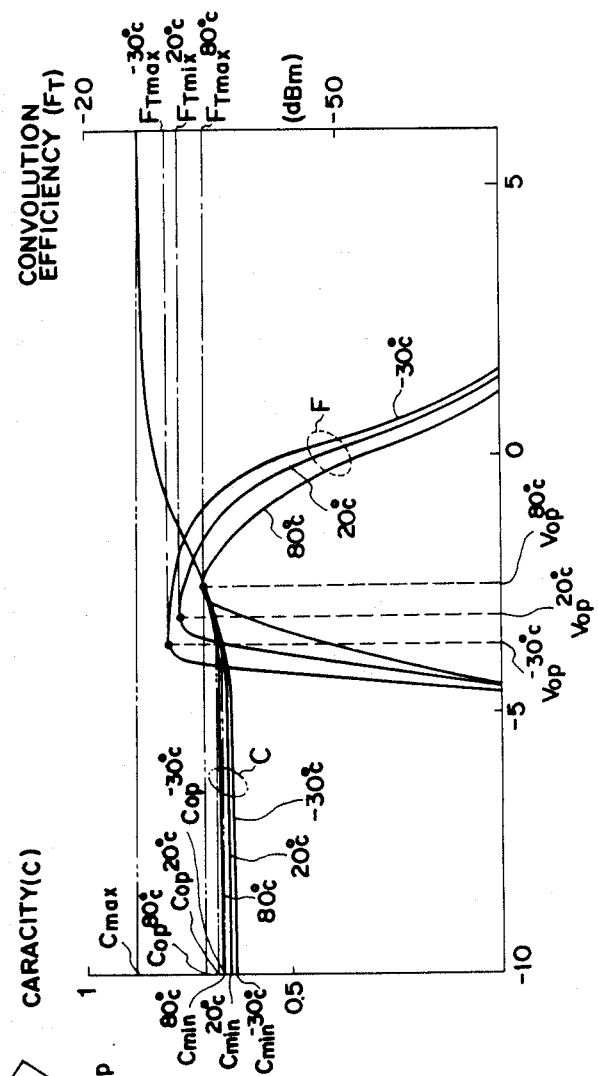
FIG. 14 is another graph indicating the relation among the bias voltage (V), the convolution efficiency ($F_\tau$) and the capacity between the gate electrode and the ground (C)

The reference capacitance should be set to a value, which is proportional to $C_{OP}$ indicated in FIG. 14. As stated previously, when the fixed impedances indicated in FIGS. 8 and 9 satisfy the following relation;

$Z_b = kZ_a$ (k: real number)

the reference capacitance (be $C_r$) should be set as follows;

$C_r = 1/k \ C_{op}$

However, as indicated in FIG. 14, the capacitance $C_{OP}$ of the gate electrode at the optimum bias voltage $V_{OP}$ varies, depending on the temperature. Consequently, if the reference capacitance were a fixed capacitance, it would be difficult to operate the circuit as an optimum bias circuit, when the ambiant temperature varies. The reference capacitance $C_r$ also should be varied according to Eq. (5), depending on the temperature variations of $C_{OP}$. This is the background for the use of the monitor electrode 109 indicated in FIGS. 6 and 7 according to this invention.

Now it is supposed that, when the area of the monitor electrode indicated in FIGS. 6 and 7 is 1/k times as great as the area of the gate electrode, the fixed impedances $Z_a$ and $Z_b$ of the impedance bridge 111 are set so as to satisfy Eq. (1). At this time, since the capacity of the monitor electrode 109 is also multiplied by 1/k, it is possible to regulate it so as to be in accordance with the capacity satisfying Eq. (5) by regulating the bias voltage $V_M$ of the monitor electrode. For the structure indicated in FIG. 7 also it is possible to use the capacity of the monitor electrode as the reference capacity, if the series capacitance $C_S$ indicated in FIG. 10 is set so as to be equal to the capacitance of the piezo-electric film, as stated previously.

One of the methods for determining the bias voltage $V_M$ of the monitor electrode 109 is to set it so that the surface of the semiconductor is strongly inverted. The capacitance $C_{min}$ in this case is smaller than the capacity $C_{op}$ at the optimum bias voltage $V_{op}$, as indicated in FIG. 14, but this difference can be regulated by connecting the parallel capacitance $C_P$ indicated in FIGS. 8, 9, and 10. Although the optimum bias capacitance $C_{op}$ varies depending on the temperature, as indicated in FIG. 14, the capacitance $C_{min}$ at the strong inversion varies also in a similar manner. Consequently, even if the value of $C_P$ is fixed, it is possible that the variations of the reference capacitance, which is the sum of the capacitance at the strong inversion and $C_P$, with respect to the temperature are not remarkably different from the variations of $C_{op}$ with respect to the temperature. This is an important advantage of the use of the monitor electrode 109 indicated in FIGS. 6 and 7.

Further, in the case indicated in FIG. 7, since it is possible to apply the bias voltage directly to the MOS structure, as indicated in FIG. 10, an advantage can be obtained that the convolver can be operated with a bias voltage smaller than that for the case indicated in FIG. 7.

As explained above, the convolver described above has a structure, which is extremely advantageous for finding out the optimum bias voltage. Furthermore the optimum bias circuit constructed by using a convolver having this structure is specifically efficient for the improvement of the temperature characteristics.

Figure 16:
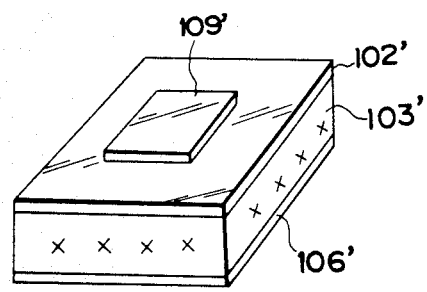
Figure 17:
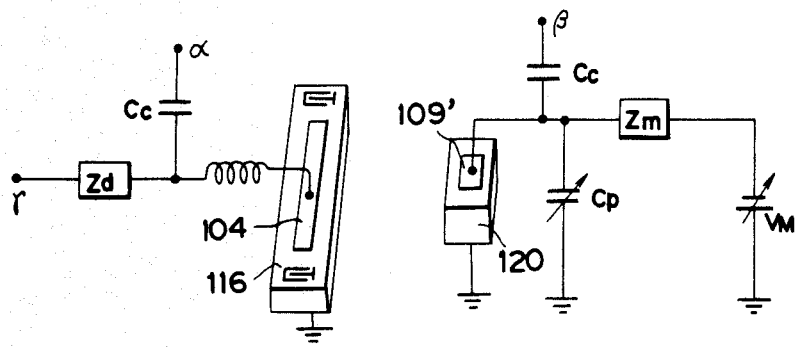
FIG. 17 is schemes of peripheral circuits for the convolver and the reference element corresponding to FIG. 8 or 9.
Figure 18:
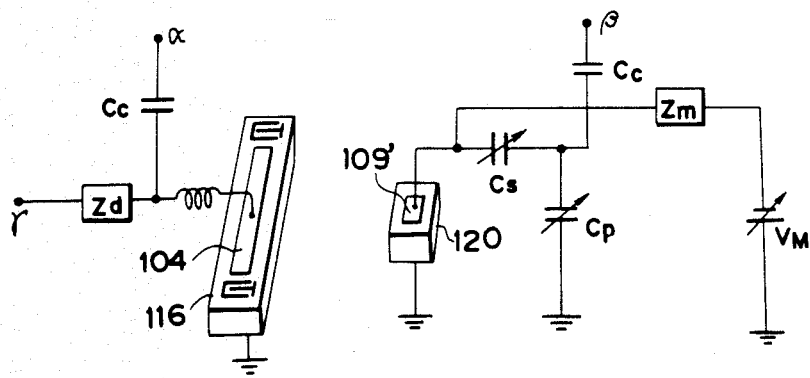
FIG. 18 is schemes of peripheral circuits for the convolver and the reference element corresponding to FIG. 10.

Although the monitor electrode 109 is formed in one body together with an SAW convolver in the above embodiments, this is not always necessary, but it is possible also to form the monitor electrode 109 on a reference element 120, which is separated from the SAW convolver. FIGS. 15 and 16 are perspective views of reference elements 120; FIG. 17 is schemes of peripheral circuits for the convolver 116 and the reference element 120 corresponding to FIGS. 8 and 9; and FIG. 18 is schemes of peripheral circuits for the convolver 116 and the reference element 120 corresponding to FIG. 10. When the terminals $\alpha$, $\beta$ and $\gamma$ in FIGS. 17 and 18 are connected with the terminals $\alpha$, $\beta$ and $\delta$ in FIGS. 8 and 9, an SAW convolver and an optimum bias circuit using a reference element separated therefrom are constructed. The reference element 120 indicated in FIG. 15 consists of a rear surface electrode 106', a semiconductor substrate 103', an insulating film 102', a piezo-electric film 101' and a monitor electrode 109', and the reference element 120 indicated in FIG. 16 consists of a rear surface electrode 106', a semiconductor substrate 103', an insulating film 102', and a monitor electrode 109'. The optimum bias circuit having these constructions can be operated similarly to the case where the elements indicated in FIGS. 6 and 7 are used. However, since the temperature of the reference element 120 has a temperature, which is not always equal to that of the convolver 116, it is thought that the temperature characteristics of the circuit, in which the reference element 120 indicated in FIGS. 15 and 16 is used, are inferior to those of the circuit, in which the SAW convolver indicated in FIGS. 6 and 7 is used.

As explained above, according to this invention, since it is possible to apply instantaneously the optimum bias voltage to the SAW convolver and further since, even if the ambient temperature varies, the optimum bias voltage is automatically searched and applied thereto, the warming up time of the SAW convolver can be considerably shortened and its temperature characteristics can be improved. In particular, since the circuit according to this invention can be operated essentially without input signal of the convolver and in addition the frequency of the signal for the bridge used in this circuit can be set independently of the working frequency of the convolver, an advantage can be also obtained that it can be operated without influencing the convolution output.

The optimum bias circuit for the convolver according to this invention can be used not only for all sorts of devices using SAW convolvers but also for correlators, spread spectrum communication devices, radars, image processing devices, Fourier transformers, etc.

While particular embodiments of the invention have been shown and described, it will be obvious to those skilled in the art that various changes and modifications may be made without departing from the present invention in its broader aspect.

The embodiments of the invention in which an exclusive property or privilege is claimed are defined as follows:

1. An optimum bias circuit for a convolver comprising:
    (a) an impedance bridge which includes a plurality of fixed impedances, a reference impedance and a convolver having a gate;
    (b) a first amplifier amplifying a first output from said bridge;
    (c) a signal source which supplies a signal to said bridge;
    (d) a second amplifier amplifying a second output from said bridge;
    (e) phase detector means for detecting the phase of the output of said first amplifier by using the output of said second amplifier as a reference signal;
    (f) a DC amplifier amplifying the output of said phase detector means; and
    (g) integrating means for integrating the output of said DC amplifier and for applying a signal thus obtained to said gate of said convolver.

2. An optimum bias circuit for a convolver according to claim 1, wherein said first amplifier is a normal amplifier; said second amplifier is a differential amplifier having two inputs; one end of said impedance bridge is grounded; said first output of said bridge is taken out from the other end of the diagonal passing through said one end; and said signal from said signal source is applied to the other two ends of said impedance bridge and at the same time serves as said second output and is applied to the two inputs of said second amplifier.

3. An optimum bias circuit for a convolver according to claim 1, wherein said amplifier is a differential amplifier having two inputs; said second amplifier is a normal amplifier; one end of said impedance bridge and one end of said signal source are grounded; the signal from said signal source is applied to the other end of the diagonal passing through said grounded end of said impedance bridge, and serves as said second output and is applied to said second amplifier; and said first output of said bridge is taken out from the other two ends of said impedance bridge and is applied to the two inputs of said first amplifier.

4. The optimum bias circuit for a convolver according to claim 1, wherein said convolver has a rear electrode thereon at a location spaced from said gate;

wherein said impedance bridge includes a first of said fixed impedances having ends respectively coupled to first and second nodes of said bridge, a second of said fixed impedances having ends respectively coupled to said second node and a third node of said bridge, a third of said fixed impedances having ends respectively coupled to said second node and a fourth node of said bridge, a first capacitor and said reference impedance connected between said third and fourth nodes in series with each other, and an inductor having one end connected to said gate and the other end connected to an end of a second capacitor, said second capacitor having a further end connected to one of said first and fourth nodes and said rear electrode being coupled to the other of said first and fourth nodes; wherein one of said first and second outputs of said bridge is the voltage between said first and third nodes, and the other thereof is the voltage between said second and fourth nodes; and wherein said signal from said integrating means is applied to said other end of said inductor.

5. An optimum bias circuit for a convolver comprising:
 (a) an impedance bridge which includes a plurality of fixed impedances, a reference impedance and a convolver having a gate;
 (b) a first amplifier amplifying a first output from said bridge;
 (c) a signal source which supplies a signal to said bridge;
 (d) a second amplifier amplifying a second output from said bridge;
 (e) phase detector means for detecting the phase of the output of said first amplifier by using the output of said second amplifier as a reference signal;
 (f) integrating means for integrating the output of said phase detector means; and
 (g) a DC amplifier amplifying the output of said integrating means and applying a signal thus obtained to said gate of said convolver.

6. An optimum bias circuit for a convolver according to claim 5, wherein said first amplifier is a normal amplifier; said second amplifier is a differential amplifier having two inputs; one end of said impedance bridge is grounded; said first output of said bridge is taken out from the other end of the diagonal passing through said one end; and said signal from said signal source is applied to the other two ends of said impedance bridge and at the same time serves as said second output and is applied to the two inputs of said second amplifier.

7. An optimum bias circuit for a convolver according to claim 5, wherein said first amplifier is a differential amplifier having two inputs; said second amplifier is a normal amplifier; one end of said impedance bridge and one end of said signal source are grounded; the signal from said signal source is applied to the other end of the diagonal passign through said grounded end of said impedance bridge, and serves as said second output and is applied to said second amplifier; and said first output of said bridge is taken out from the other two ends of said impedance bridge and is applied to the two inputs of said first amplifier.

8. The optimum bias circuit for a convolver according to claim 5, wherein said convolver has a rear electrode thereon at a location spaced from said gate; wherein said impedance bridge includes a first of said fixed impedances having ends respectively coupled to first and second nodes of said bridge, a second of said fixed impedances having ends respectively coupled to said second node and a third node of said bridge, a third of said fixed impedances having ends respectively coupled to said second node and a fourth node of said bridge, a first capacitor and said reference impedance connected between said third and fourth nodes in series with each other, and an inductor having one end connected to said gate and the other end connected to an end of a second capacitor, said second capacitor having a further end connected to one of said first and fourth nodes and said rear electrode being coupled to the other of said first and fourth nodes; wherein one of said first and second outputs of said bridge is the voltage between said first and third nodes, and the other thereof is the voltage between said second and fourth nodes; and wherein said signal from said DC amplifier is applied to said other end of said inductor.

9. An optimum bias circuit for a convolver comprising:
 (a) an impedance bridge which includes a plurality of fixed impedances, a reference impedance and a convolver having a gate;
 (b) a first amplifier amplifying a first output from said bridge;
 (c) a signal source which supplies a signal to said bridge;
 (d) a second amplifier amplifying a second output from said bridge;
 (e) phase detector means for detecting the phase of the output of said first amplifier by using the output of said second amplifier as a reference signal;
 (f) a DC amplifier amplifying the output of said phase detector means; and
 (g) a low pass filter coupled to the output of said DC amplifier and having a cut-off frequency which is low with respect to a frequency of the signal from said signal source, a signal output by said low pass filter being applied to said gate of said convolver.

10. An optimum bias circuit for a convolver according to claim 9, wherein said first amplifier is a normal amplifier; said second amplifier is a differential amplifier having two inputs; one end of said impedance bridge is grounded; said first output of said bridge is taken out from the other end of the diagonal passing through said one end; and said signal from said signal source is applied to the other two ends of said impedance bridge and at the same time serves as said second output and is applied to the two inputs of said second amplifier.

11. An optimum bias circuit for a convolver according to claim 9, wherein said first amplifier is a differential amplifier having two inputs; said second amplifier is a normal amplifier; one end of said impedance bridge and one end of said signal source are gounded; the signal from said signal source is applied to the other end of the diagonal passing through said grounded end of said impedance bridge, and serves as said second output and is applied to said second amplifier; and said first output of said bridge is taken out from the other two ends of said impedance bridge and is applied to the two inputs of said first amplifier.

12. The optimum bias circuit for a convolver according to claim 9, wherein said convolver has a rear electrode thereon at a location spaced from said gate; wherein said impedance bridge includes a first of said fixed impedances having ends respectively coupled to first and second nodes of said bridge, a second of said fixed impedances having ends respectively coupled to said second node and a third node of said bridge, a third of said fixed impedances having ends respectively coupled to said second node and a fourth node of said bridge, a first capacitor and said reference impedance connected between said third and fourth nodes in series with each other, and an inductor having one end connected to said gate and the other end connected to an end of a second capacitor, said second capacitor having a further end connected to one of said first and fourth nodes and said rear electrode being coupled to the other of said first and fourth nodes; wherein one of said first and second outputs of said bridge is the voltage between said first and third nodes, and the other thereof is the voltage between said second and fourth nodes; and wherein said signal from said low pass filter is applied to said other end of said inductor.

13. An optimum bias circuit for a convolver, comprising:
a monolithic surface acoustic wave convolver having a multilayer structure and having a gate electrode, a rear surface electrode and a metallic electrode which is disposed in the proximity of the gate electrode, said metallic electrode serving as a monitor electrode;
an impedance bridge which includes an impedance provided within said convolver between said gate electrode and said rear surface electrode, an impedance provided within said convolver between said monitor electrode and said rear surface electrode, a capacitor having its ends respectively coupled to said monitor electrode and a first node of said bridge, and three fixed impedances, a first of said fixed impedances having its ends respectively coupled to said first node and to a second node of said bridge, a second of said fixed impedances having its ends respectively coupled to said second node and to a third node of said bridge, said gate electrode being coupled to said third node, said rear surface electrode being coupled to a fourth node of said bridge, and a third of said fixed impedances having its ends respectively coupled to one of said first and second nodes and to one of said third and fourth nodes, respectively;
a signal source which applies a signal to said impedance bridge;
a phase detector which detects the phase of an output signal from said bridge relative to said signal from said source;
an amplifier which amplifies an output of said phase detector; and
a circuit which is one of an integrator and a low pass filter, which is coupled to an output of said amplifier, and which has an output coupled to said gate electrode.

14. An optimum bias circuit for a convolver according to claim 13, wherein said impedance between said monitor electrode and said rear surface electrode is regulated by applying a bias voltage to said monitor electrode which is independent of a bias voltage applied to said gate electrode.

15. An optimum bias circuit for a convolver according to claim 14, wherein said convolver includes a semiconductor portion having thereon a surface; wherein a balancing point of said impedance bridge is determined by regulating the capacitor coupled to said monitor electrode, said bias voltage applied to said monitor electrode being sufficiently high so that said surface of said semiconductor is strongly inverted.

16. The optimum bias circuit according to claim 13, wherein said bridge includes a further capacitor having first and second ends and an inductor having first and second ends, said further capacitor and said inductor having their first ends connected together and their second ends respectively coupled to said third node and gate electrode, including an impedance having its ends respectively coupled to said first end of said inductor and said output of said one of said integrator and said low pass filter, and including an impedance and a variable voltage source connected between said monitor electrode and said fourth node in series with each other.

17. The optimum bias circuit according to claim 16, including a variable capacitance having its ends respectively coupled to said monitor electrode and said fourth node.

18. The optimum bias circuit according to claim 16, wherein said first-mentioned capacitor includes a variable capacitance having a first end connected to said monitor electrode and having a second end, and includes a fixed capacitance having its ends respectively connected to said first node and to said second end of said variable capacitance; and including a variable capacitor having its ends respectively coupled to said second end of said variable capacitance and said fourth node.

19. The optimum bias circuit according to claim 16, wherein said output signal from said bridge is the voltage between said second and fourth nodes.

20. A monolithic surface acoustic wave convolver having a multi-layer structure, comprising: a semiconductor substrate which is divided into first and second portions, said first portion including an insulating film, a piezoelectric film provided on said insulating film, a gate electrode provided on said piezoelectric film, and a pair of comb-shaped electrodes formed on said piezoelectric film on opposite sides of said gate electrode, and said second portion including an insulating film, a piezoelectric film provided on said insulating film, and a monitor electrode which is a metallic electrode provided on said piezoelectric film, and a rear surface electrode having first and second portions respectively provided on said first and second portions of said substrate at locations thereon remote from said gate and monitor electrodes, respectively.

21. The convolver according to claim 20, wherein said first and second portions of said substrate are physically separate parts.

22. The convolver according to claim 20, wherein said first and second portions of said substrate are respective portions of a single integral substrate part.

23. A monolithic surface acoustic wave convolver having a multi-layer structure, comprising: a semiconductor substrate which is divided into first and second portions, said first portion including an insulating film, a piezoelectric film provided on said insulating film, a gate electrode provided on said piezoelectric film, and a pair of comb-shaped electrodes formed on said piezoelectric film on opposite sides of said gate electrode, and said second portion including an insulating film, and a monitor electrode which is a metallic electrode provided on said insulating film, and a rear surface electrode having first and second portions respectively provided on said first and second portions of said substrate at locations thereon remote from said gate and monitor electrodes, respectively.

24. The convolver according to claim 23, wherein said first and second portions of said substrate are physically separate parts.

25. The convolver according to claim 23, wherein said first and second portions of said substrate are respective portions of a single integral substrate part.

* * * * *

UNITED STATES PATENT AND TRADEMARK OFFICE
CERTIFICATE OF CORRECTION

PATENT NO. : 4 798 988

DATED : January 17, 1989

INVENTOR(S) : Syuichi MITSUTSUKA

It is certified that error appears in the above-identified patent and that said Letters Patent is hereby corrected as shown below:

Column 10, line 55; after "said" insert ---first---.

Column 11, line 56; change "passign" to ---passing---.

Column 12, line 52; change "gounded" to ---grounded---.

Signed and Sealed this

Twenty-first Day of November, 1989

Attest:

JEFFREY M. SAMUELS

*Attesting Officer*  *Acting Commissioner of Patents and Trademarks*